United States Patent
Rey et al.

(10) Patent No.: US 8,872,558 B1
(45) Date of Patent: Oct. 28, 2014

(54) HYBRID PHASE-LOCKED LOOPS

(71) Applicant: Intel IP Corporation, Santa Clara, CA (US)

(72) Inventors: Claudio Rey, Tempe, AZ (US); David Harnishfeger, Chandler, AZ (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 13/902,580

(22) Filed: May 24, 2013

(51) Int. Cl.
*H03L 7/06* (2006.01)
*H03L 7/08* (2006.01)

(52) U.S. Cl.
CPC ................................ *H03L 7/0802* (2013.01)
USPC ............................ 327/159; 327/149; 327/158

(58) Field of Classification Search
USPC .......................................... 327/149, 158, 159
See application file for complete search history.

(56) References Cited

U.S. PATENT DOCUMENTS

| | | | |
|---|---|---|---|
| 5,012,460 A * | 4/1991 | Popovich et al. .......... | 369/30.13 |
| 5,978,425 A | 11/1999 | Takla | |
| 6,028,460 A | 2/2000 | McCollum et al. | |
| 7,085,949 B2 * | 8/2006 | Mar et al. ....................... | 713/400 |
| 7,526,395 B2 * | 4/2009 | Sullivan et al. ................. | 702/79 |
| 8,154,350 B2 | 4/2012 | Faison | |
| 8,339,165 B2 | 12/2012 | Dunworth et al. | |
| 8,441,323 B2 * | 5/2013 | Lucas et al. .................... | 331/1 A |
| 2006/0033582 A1 * | 2/2006 | Staszewski et al. ............. | 331/16 |
| 2008/0309376 A1 * | 12/2008 | Song et al. .......................... | 327/2 |
| 2009/0063072 A1 * | 3/2009 | Sullivan et al. ................. | 702/70 |
| 2011/0169578 A1 * | 7/2011 | Lucas et al. ..................... | 331/25 |
| 2012/0249196 A1 * | 10/2012 | Akaike et al. ................. | 327/156 |
| 2013/0181770 A1 * | 7/2013 | Sasaki ........................... | 329/307 |

* cited by examiner

*Primary Examiner* — Adam Houston
(74) *Attorney, Agent, or Firm* — Baker Botts, LLP

(57) ABSTRACT

A method of controlling a hybrid phase-locked loop may include generating a first control signal based on an offset signal and a second control signal and determining a difference between the first and the second control signals. The method may further include adjusting a value of the offset signal based on the difference between the first and the second control signals to drive a level of the first control signal to a level of the second control signal. The method may further include determining when the level of the first control signal crosses the level of the second control signal. After the level of the first control signal crosses the level of the second control signal, the method may include adjusting the value of the offset signal based on a number of occurrences of the level of the first control signal crossing the level of the second control signal.

7 Claims, 9 Drawing Sheets

HYBRID PHASE-LOCKED LOOPS

FIELD

The embodiments discussed herein are related to hybrid phase-locked loops.

BACKGROUND

Phase-locked loops (PLLs) have been applied to many applications ranging from generating clock signals in microprocessors to synthesizing frequencies. In general, a PLL may include an oscillator that generates an output signal with a frequency that is locked onto a frequency of a reference signal. To lock the frequency of the output signal with the frequency of the input signal, a PLL may include a phase detector (PD) configured to compare the phase of the reference signal to the phase of an output signal generated by the oscillator, and to generate a PD output that is proportional to the phase difference between the phase of the input signal and the phase of the output signal.

Through the feedback of the output signal to the PD, the PLL drives the frequency of the output signal to the frequency of the input signal and matches the phase of the output signal with the phase of the input signal. The PLL may also assist in correcting any phase misalignment resulting from internal or external noise sources.

PLLs may be digital or analog. Both digital PLLs and analog PLLs have strengths. For example, an output of a digital PLL may be locked quicker to a frequency than an output of an analog PLL, while an analog PLL may have lower power consumption than a digital PLL.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a method of controlling a hybrid phase-locked loop may include generating a first control signal based on an offset signal and a second control signal and determining a difference between the first and the second control signals. The method may further include adjusting a value of the offset signal based on the difference between the first and the second control signals to drive a level of the first control signal to a level of the second control signal. The method may further include determining when the level of the first control signal crosses the level of the second control signal. After the level of the first control signal crosses the level of the second control signal, the method may include adjusting the value of the offset signal based on a number of occurrences of the level of the first control signal crossing the level of the second control signal.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Figure 1:
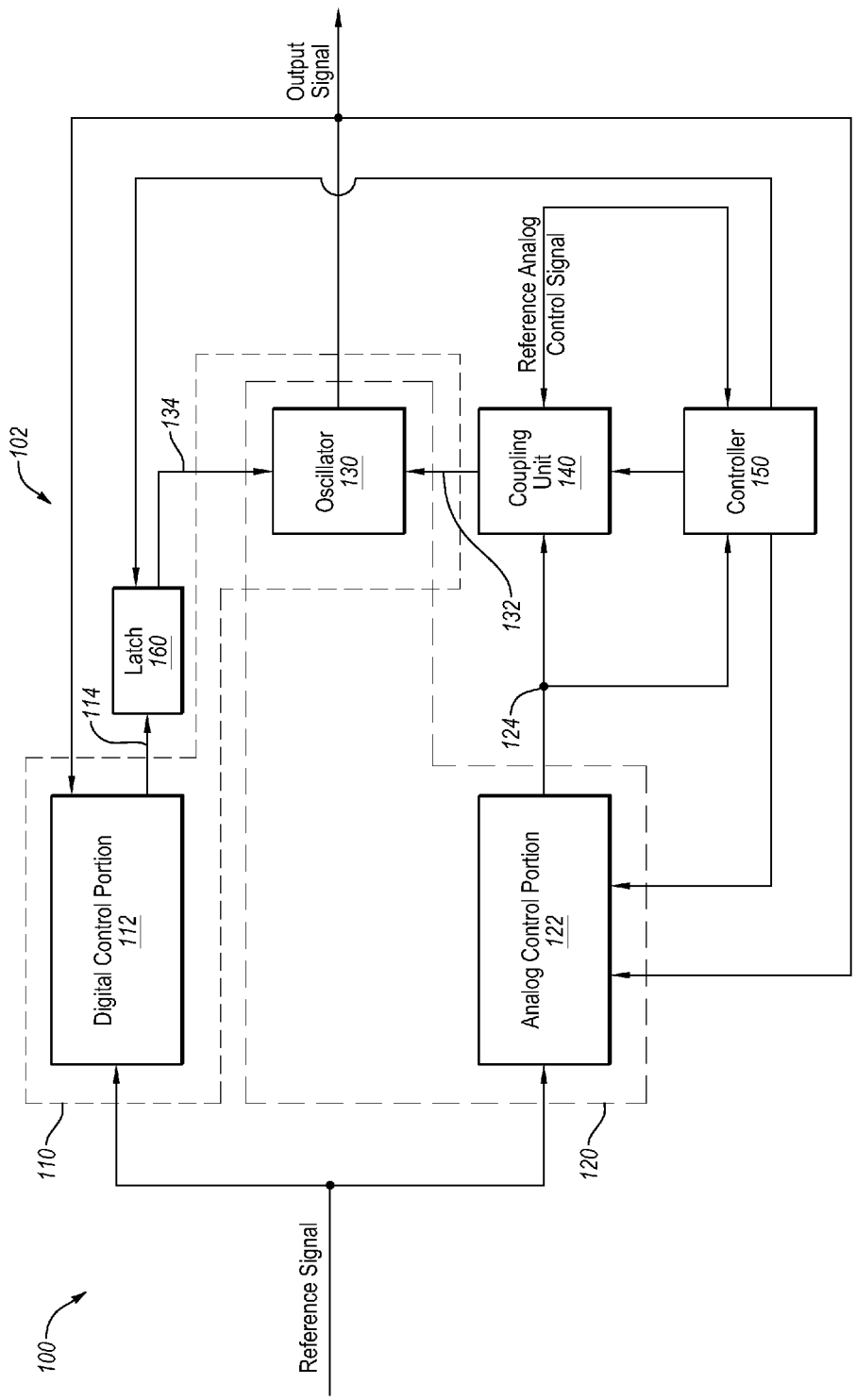
FIG. 1 is a block diagram of an example circuit that includes a hybrid phase-locked loop (PLL)

According to an aspect of an embodiment, a circuit is described that includes a hybrid phase-locked loop (PLL), which includes a digital PLL and an analog PLL. The hybrid PLL is configured so that the digital PLL and the analog PLL may operate independently. As a result, the advantages of the digital PLL and the analog PLL may both be exploited. For example, the digital PLL may be used to obtain an output signal with a frequency and a phase that after being divided matches a frequency and a phase of a reference signal. After the output signal is obtained, the digital PLL may stop operation and transfer control of the output signal to the analog PLL. By obtaining the output signal using the digital PLL and then transferring control to the analog PLL, the hybrid PLL is able to take advantage of the fast convergence and calibration of a digital PLL and the low current consumption and fewer spurs of an analog PLL. To allow the digital PLL to transfer control of the output signal to the analog PLL, the digital PLL and the analog PLL may share an oscillator that is controlled based on digital and analog control signals.

The hybrid PLL described is configured to match the analog control signal provided by the digital loop with that produced by the analog loop divider, phase detector and loop filter before control of the output signal is transferred by the digital loop to the analog loop. By matching the control signals provided by the digital PLL and the analog PLL, glitches and other transients (e.g., noise) on the output signal as a result of transferring control of the output signal may be reduced. To match the control signals provided by the digital PLL and the analog PLL, the control signal of the analog PLL, referred to as a tuning analog control signal, is driven to approximately equal a reference analog control signal used by the oscillator when the digital PLL is controlling the output signal. To drive the control signal to approximately equal the reference analog control signal, a controller compares the tuning analog control signal with the reference analog control signal. Based on a difference between the tuning analog control signal and the reference analog control signal, the controller adjusts the phase of the division of the output signal to drive the tuning analog control signal to approximately equal the reference analog control signal.

In some embodiments, the controller may adjust (proportionally or otherwise) a value of an offset signal used to adjust the division of the output signal. The value of the offset signal may be large when a difference between the tuning analog control signal and the reference analog control signal is large and small when the difference between the tuning analog control signal and the reference analog control signal is small. The controller may adjust the value of the offset signal until a level of the tuning analog control signal crosses a level of the reference analog control signal, referred to herein as a convergence crossing. After a convergence crossing, the controller may reduce the value of the offset signal based on a number of convergence crossings of the tuning analog control signal. After a certain number of convergence crossings, the controller may determine that the tuning analog control signal is approximately equal to the reference analog control signal and may transfer control of the output signal from the digital PLL to the analog PLL.

Embodiments of the present invention will be explained with reference to the accompanying drawings.

FIG. 1 is a block diagram of an example circuit 100 that includes a hybrid PLL 102, arranged in accordance with at least some embodiments described herein. The circuit 100 may include a digital PLL 110 and an analog PLL 120 that collectively form the hybrid PLL 102, a coupling unit 140, a controller 150, and a latch 160. The circuit 100 may be configured to have the digital PLL 110 generate and control an output signal and then transfer control of the output signal to the analog PLL 120. After the digital PLL 110 transfers control of the output signal to the analog PLL 120, the enable signals or the clocks supplied to the digital PLL 110 may be removed to stop the operation of the digital PLL 110 while the analog PLL 120 controls the output signal.

In general, the digital PLL 110 may be configured to generate an output signal. The output signal may be fed back to the digital PLL 110. Based on a comparison between the output signal and a reference signal, the digital PLL 110 may control the output signal to maintain a frequency and a phase of the output signal approximately equal to a frequency and a phase of the reference signal. The digital PLL 110 may control the output signal by adjusting the frequency and/or the phase of the output signal to drive the output signal to approximately match the reference signal. In this manner, the digital PLL 110 is a feedback system. In some embodiments, the output signal may be divided by the digital PLL 110 and then compared to the reference signal. In these and other embodiments, the digital PLL 110 may control the output signal to maintain a frequency and a phase of the divided output signal approximately equal to the reference signal. In these and other embodiments, the digital PLL 110 may be referred to as a digital synthesizer.

The analog PLL 120 may also be configured to generate the output signal. The output signal may be feedback to the analog PLL 120. Based on a comparison between the output signal and the reference signal, the analog PLL 120 may control the output signal to maintain a frequency and a phase of the output signal approximately equal to a frequency and a phase of the reference signal. The analog PLL 120 may control the output signal by adjusting the frequency and/or the phase of the output signal to drive the output signal to approximately match the reference signal. In this manner, the analog PLL 120 is a feedback system. In some embodiments, the output signal may be divided by the analog PLL 120 and then compared to the reference signal. In these and other embodiments, the analog PLL 120 may control the output signal to maintain a frequency and a phase of the divided output signal approximately equal to a frequency and a phase of the reference signal. In these and other embodiments, the analog PLL 120 may be referred to as an analog synthesizer.

Note that while both the analog PLL 120 and the digital PLL 110 may be configured to control the output signal, in general, one of the analog PLL 120 or the digital PLL 110 may control the output signal at a given time. Control of the output signal by the analog PLL 120 and the digital PLL 110 as discussed herein may indicate that the PLL controlling the output signal is actively comparing the output signal or a divided output signal to a reference signal and adjusting the output signal accordingly. Furthermore, an output signal as discussed herein may be based on multiple types of signals. However, an output signal being based on multiple signals does not indicate that the output signal is controlled by the multiple signals. Rather, control of the output signal is performed by a signal that is currently being generated based on a frequency and/or a phase difference between the output signal or the divided output signal and a reference signal.

To allow both the analog PLL 120 and the digital PLL 110 to generate and control the output signal, both the digital PLL 110 and the analog PLL 120 may include the same oscillator, an oscillator 130. The oscillator 130 may include a digital signal port and an analog signal port. The oscillator 130 may be configured to generate the output signal based on a digital signal 134 at the digital signal port and an analog signal 132 at the analog signal port. A change in either the digital signal 134 or the analog signal 132 may adjust the output signal by adjusting the frequency and/or the phase of the output signal. Thus, control of the oscillator 130 and of the output signal may be achieved by changing the digital signal 134 and/or the analog signal 132.

When the digital PLL 110 is configured to control the output signal, the digital PLL 110 may be configured to generate and provide a tuning digital control signal 114 based on the reference signal and the output signal to the oscillator 130 as the digital signal 134. When the tuning digital control signal 114 is being provided to the oscillator 130, the analog signal 132 may be a reference analog control signal that is not provided by the analog PLL 120, so that digital PLL 110 may control the output signal.

When the analog PLL 120 is configured to control the output signal, the analog PLL 120 may be configured to generate and provide a tuning analog control signal 124 based on the reference signal and the output signal to the oscillator 130 as the analog signal 132. When the tuning analog control signal 124 is being provided to the oscillator 130, the digital signal 134 may be a previous tuning digital control signal 114 or a filtered version of the previous tuning digital control signal 114 that is generated by the digital PLL 110 before control is passed to the analog PLL 120. The digital signal 134 may be a steady signal (e.g., unchanging) while the analog PLL 120 is configured to control the output signal.

The digital PLL 110 may also include a digital control portion 112 communicatively coupled to the oscillator 130 and a latch 160. The digital control portion 112 may be configured to receive the output signal from the oscillator 130 and a reference signal and to generate the tuning digital control signal 114 based on the reference signal and the output signal. The digital control portion 112 may be configured to send the tuning digital control signal 114 to the latch 160. In some embodiments, the digital control portion 112 may divide the output signal. In these and other embodiments, the digital control portion 112 may be configured to generate the tuning digital control signal 114 based on the reference signal and the divided output signal. In particular, the digital control portion 112 may be configured to generate the tuning digital control signal 114 based on a difference between frequencies of the reference signal and the divided output signal.

The latch 160 may be communicatively coupled to the digital control portion 112, the oscillator 130, and the controller 150, and may be configured to receive the tuning digital control signal 114 from the digital control portion 112 and a latching signal from the controller 150. When the digital PLL 110 is controlling the output signal, the latch 160 may also be configured to allow the tuning digital control signal 114 to pass through the latch 160 to the oscillator 130 as the digital signal 134. When the analog PLL 120 is controlling the output signal, the latch 160 may also be configured to latch a previous tuning digital control signal 114 and to provide the latched previous tuning digital control signal 114 to the oscillator 130 as the digital signal 134. In these and other embodiments, the latch 160 may communicatively decouple the digital control portion 112 from the oscillator 130. As a result, the latch 160 may prevent the digital PLL 110 from controlling the output signal. In some embodiments, the latch 160 may be controlled by the controller 150. In these and other embodiments, based on the latching signal from the controller 150, the latch 160 may latch the tuning digital control signal 114 or allow the tuning digital control signal 114 to pass to the oscillator 130.

In some embodiments, the latch 160 may provide a signal similar to the previous tuning digital control signal. For example, the latch 160 may filter the previous tuning digital control signal and provide the filtered previous tuning digital control signal to the oscillator 130. Alternately or additionally, the latch 160 may receive or generate a digital signal that is related to the tuning digital control signal. In these and other embodiments, the latch 160 may provide the related digital signal to the oscillator 130. The related digital signal may be such that it causes the oscillator 130 to operate in a manner similar to operation of the oscillator 130 when it receives the previous tuning digital control signal. Thus, the latch 160 may provide a digital signal to the oscillator 130 when the digital control portion 112 is communicatively decoupled the from the oscillator 130 that is similar to or equal to the previous tuning digital control signal 114 to maintain a similar operation of the oscillator 130.

The analog PLL 110 may include an analog control portion 122 communicatively coupled to the coupling unit 140 and the controller 150. The analog control portion 122 may be configured to receive the output signal from the oscillator 130 and a reference signal. Based on the reference signal and the output signal, the analog PLL 110 may generate the tuning analog control signal 124. The analog control portion 122 may be configured to send the tuning analog control signal 124 to the coupling unit 140. In some embodiments, the analog control portion 122 may divide the output signal. In these and other embodiments, the analog control portion 122 may be configured to generate the tuning analog control signal 124 based on the reference signal and the divided output signal. In particular, the analog control portion 122 may be configured to generate the tuning analog control signal 124 based on a difference between frequencies of the reference signal and the divided output signal.

The coupling unit 140 may be communicatively coupled to the analog control portion 122, the controller 150, and the oscillator 130. The coupling unit 140 may receive the tuning analog control signal 124 from the analog control portion 122, a reference analog control signal, and a switching signal from the controller 150. The coupling unit 140 may be configured to communicatively couple or decouple the analog control portion 122 with or from the oscillator 130.

When the coupling unit 140 communicatively couples the analog control portion 122 with the oscillator 130, the coupling unit 140 may be configured to provide the tuning analog control signal 124 to the oscillator 130 as the analog signal 132. When the coupling unit 140 communicatively decouples the analog control portion 122 from the oscillator 130, the coupling unit 140 may be configured to provide the reference analog control signal to the oscillator 130 as the analog signal 132. The coupling unit 140 may communicatively couple or decouple the analog control portion 122 with or from the oscillator 130 based on the switching signal from the controller 150. In particular, when the digital PLL 110 is controlling the output signal, the coupling unit 140 may communicatively decouple the analog PLL 120 from the oscillator 130 and provide the reference analog control signal to the oscillator 130. When the analog PLL 120 is controlling the output signal, the coupling unit 140 may communicatively couple the analog control portion 122 and the oscillator 130 and provide the tuning analog control signal 124 to the oscillator 130. In some embodiments, the reference analog control signal and/or the tuning analog control signal 124 may be voltage. For example, the reference analog control signal may be a portion of or all of a supply voltage to the circuit 100.

The controller 150 may be communicatively coupled to the coupling unit 140, the latch 160, and the analog control portion 122 and may be configured to receive the tuning analog control signal 124 from the analog control portion 122 and the reference analog control signal. After the digital PLL 110 generates and controls the output signal so that the frequency of the output signal or the divided output signal is approximately equal to the frequency of the reference signal, the controller 150 may compare the tuning analog control signal 124 to the reference analog control signal. Based on the comparison of the tuning analog control signal 124 to the reference analog control signal, the controller 150 may generate and provide an offset signal to the analog control portion 122. The offset signal may be configured to cause the analog control portion 122 to adjust the tuning analog control signal 124. In particular, the offset signal may cause the analog control portion 122 to drive the tuning analog control signal 124 to approximate the reference analog control signal. In some embodiments, the offset signal may adjust a divisor of a divider within the analog control portion 122. By adjusting the divisor of the divider, a divided output signal that is compared to the reference signal may be changed. The change in the difference between the divided output signal and the reference signal may drive the tuning analog control signal 124 to approximate the reference analog control signal.

After the tuning analog control signal 124 approximates the reference analog control signal, the controller 150 may direct the latch 160 to latch the tuning digital control signal 114 and to provide the latched tuning digital control signal 114 or a related digital signal to the oscillator 130 as the digital signal 134. After the latch 160 latches the tuning digital control signal 114, the controller 150 may direct the coupling unit 140 to communicatively couple the analog control portion 122 with the oscillator 130 so that the oscillator 130 is controlled by the tuning analog control signal 124 and thus the analog PLL 122.

A brief example further explains how the circuit 100 operates to transfer control between the digital PLL 110 and the analog PLL 120. To begin, the latch 160 communicatively couples the oscillator 130 with the digital control portion 112 to allow the tuning digital control signal 114 to be provided to the oscillator 130. The coupling unit 140 also communicatively decouples the analog control portion 122 from the oscillator 130 and provides the reference analog control signal to the oscillator 130. The digital PLL 110 operates to bring the frequency of the output signal to approximately equal the frequency, respectively, of the reference signal after a change to the circuit 100. Changes to the circuit 100 may include, but are not limited to, a divisor value used in the digital control portion 112 to divide the output signal may be changed and/or the frequency and/or phase of the reference signal may be changed and/or lock on the reference signal may be lost and may be reacquired.

After the digital PLL 110 brings the frequency of the output signal to approximately equal the frequency, respectively, of the reference signal, the controller 150 operates to cause the analog control portion 122 to bring the tuning analog control signal 124 to be approximately equal to the reference analog control signal. After the tuning analog control signal 124 approximately equals the reference analog control signal, the controller 150 causes the latch 160 to latch the tuning digital control signal 114. The latch 160 then provides the latched tuning digital control signal 114 or a related digital signal as the digital signal 134 to the oscillator 130. The coupling unit 140 then communicatively couples the analog control portion 122 with the oscillator 130 to provide the tuning analog control signal 124 to the oscillator 130 and thus transfer control of the output signal to the analog PLL 120.

By matching the tuning analog control signal 124 to the reference analog control signal already being provided to the oscillator 130 and latching the tuning digital control signal 114, when the digital PLL 110 transfers control of the output signal to the analog PLL 120, the values of the digital signal 134 and the analog signal 132 provided to the oscillator 130 remain constant or approximately constant. Thus, transferring control of the output signal to the analog PLL 120 as described does not disturb, or may reduce disturbance of the output signal. Other circuits that transfer control between digital and analog PLLs may disturb the output signal, resulting in noise or transients in the output signal. Thus, the circuit 100 provides a configuration that generates an output signal using the advantages of both a digital PLL and an analog PLL while reducing or eliminating the disadvantageous disturbance of the output signal when transferring control of the output signal.

In some embodiments, the analog and digital PLL's 120 and 110 may be type I PLLs (e.g., PLL's with a loop transfer function with a single pole at the origin). Advantages of a type I PLL compared to a type II PLL (e.g., PLL with a charge pump) or a higher type PLL may include faster settling times; better linearity because the type I PLL may include a voltage based phase detector, such as an XOR gate and less complex loop filters; smaller chip size, among others. Furthermore, the circuit 100 may be well suited for transferring control between a type I digital PLL to a type I analog PLL because the circuit 100 may be able to compensate for the phase differences between a reference signal and an output signal represented in the tuning analog control signal 124 not being integrated as occurs in a type II PLL. The concepts and ideas disclosed herein may also be applicable to type II or other types of PLLs as well.

Modifications, additions, or omissions may be made to the circuit 100 without departing from the scope of the present disclosure. For example, the digital and analog PLLs 110 and 120 may include dividers. In these and other embodiments, the digital and analog PLLs 110 and 120 may operate to bring the frequency of the divided output signal to be approximately equal to the frequency of the reference signal. Furthermore, in some embodiments, the coupling unit 140 and the latch 160 may be controlled by a circuit or circuits other than the controller 150. In these and other embodiments, the controller 150 may provide a signal to the other circuit(s) indicating when the tuning analog control signal 124 is approximately equal to the reference analog control signal 124. In these and other embodiments, the other circuit(s) may control the coupling unit 140 and the latch 160.

As another example, the circuit 100 may not include the latch 160. In these and other embodiments, the circuit 100 may include another circuit, module, or object that may be configured to provide the tuning digital control signal 114 to the oscillator 130 as well as to latch the tuning digital control signal 114 and provide the latched tuning digital control signal 114 to the oscillator 130. Alternately or additionally, the latch 160 may not be configured to communicatively couple or decouple the oscillator 130 and the digital control portion 112. In these and other embodiments, the latch 160 may provide the tuning digital control signal 114 and another circuit or module, such as a switch, to communicatively couple or decouple the oscillator and the digital control portion 112. As another example, the circuit 100 may not be configured to communicatively decouple the digital control portion 112 from the oscillator 130. In these and other embodiments, when not controlling the oscillator 130, the enable signals or clocks provided to the digital control portion 112 may be removed to prevent the digital control portion 112 from supplying the tuning digital control signal 114 to the oscillator 130.

Figure 2A:
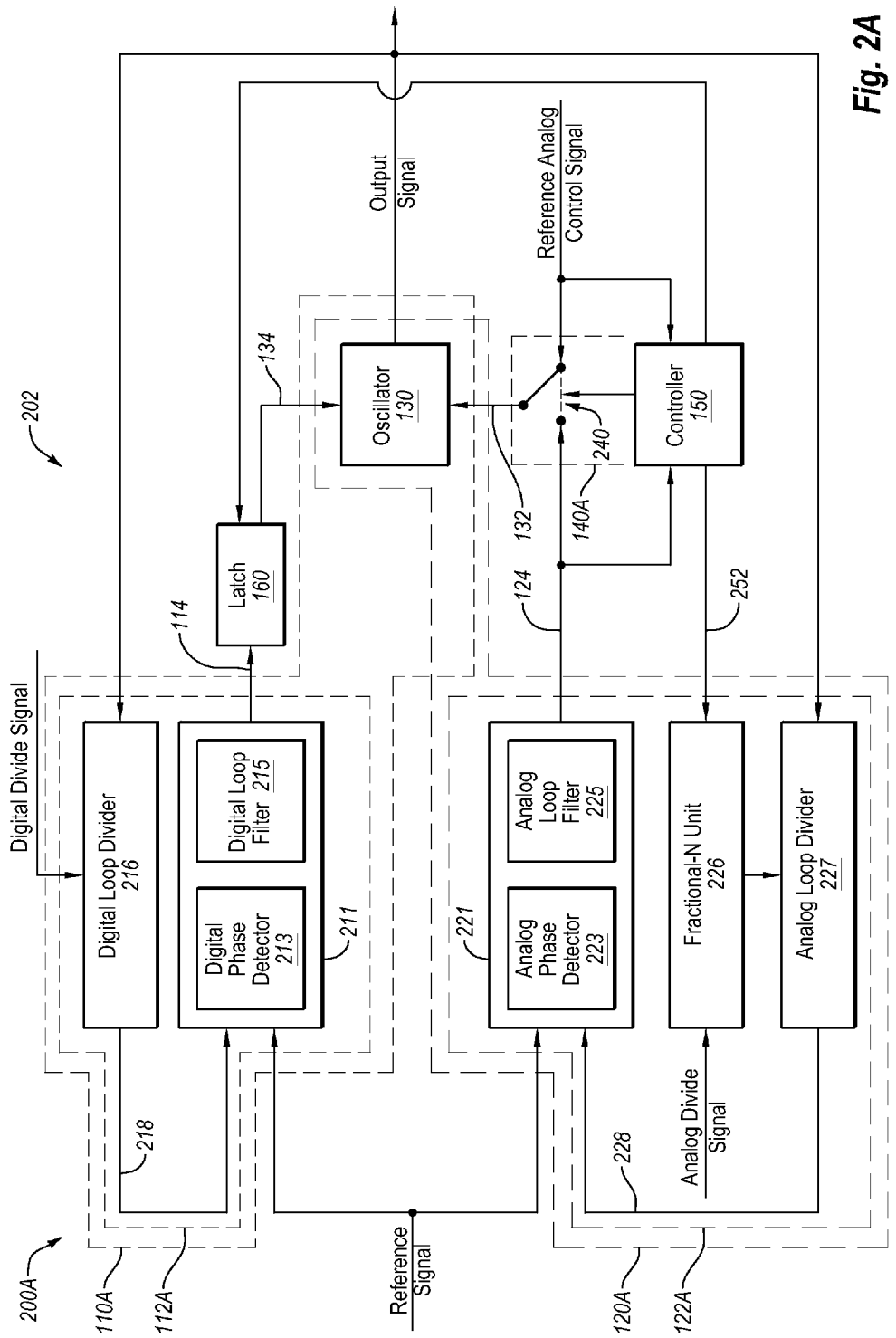
FIG. 2A is a block diagram of another example circuit that includes a hybrid PLL in a first state.

FIG. 2A is a block diagram of another example circuit 200 that includes a hybrid PLL 202 in a first state, arranged in accordance with at least some embodiments described herein. The circuit 200 may illustrate an example implementation of the circuit 100 of FIG. 1. In particular, the circuit 200 may illustrate an example implementation of the circuit 100 of FIG. 1. In some embodiments, the digital PLL 110A and the analog PLL 120A may be type I PLLs.

In this example implementation of the circuit 100 of FIG. 1, the digital PLL 110A is analogous to the digital PLL 110 of FIG. 1, the analog PLL 120A is analogous to the analog PLL 120 of FIG. 1, and the coupling unit 140A is analogous to the coupling unit 140 of FIG. 1. Furthermore, the circuit 200 includes the oscillator 130, the controller 150, and the latch 160 as described with respect to FIG. 1. Thus, no further description is provided herein with respect to FIG. 2A for the oscillator 130, the controller 150, and the latch 160.

The digital PLL 110A includes a digital control portion 112A that may be analogous to the digital control portion 112 of FIG. 1. The digital control portion 112A may include a digital control signal unit 211, which includes a digital phase detector 213 and a digital loop filter 215, and a digital loop divider 216.

The digital loop divider 216 may be communicatively coupled to the digital control signal unit 211 and to the oscillator 130 and may be configured to receive the output signal from the oscillator 130. The digital loop divider 216 may be configured to divide the output signal based on a digital divide signal to generate a digital feedback signal 218 that may be provided to the digital control signal unit 211.

The digital control signal unit 211 may be communicatively coupled to the latch 160 and the divider 216 and may be configured to receive the digital feedback signal 218 and the reference signal. The digital control signal unit 211 may be configured to generate the tuning digital control signal 114 based on a comparison of the digital feedback signal 218 and the reference signal. In particular, the digital control signal unit 211 may be configured to compare the phases of the digital feedback signal 218 and the reference signal. In these and other embodiments, the tuning digital control signal 114 may be proportional or otherwise related to a difference between the phases of the digital feedback signal 218 and the reference signal.

In some embodiments, the digital phase detector 213 may be configured to compare the phases of the digital feedback signal 218 and the reference signal and generate an output proportional or otherwise related to the difference in the phases. The digital loop filter 215 may filter the output. The filtered output may be output by the digital control signal unit 211 as the tuning digital control signal 114.

The analog PLL 120A includes an analog control portion 122A that may be analogous to the analog control portion 122 of FIG. 1. The analog control portion 122A may include an analog control signal unit 221, which includes an analog phase detector 223 and an analog loop filter 225. The analog control portion 122A may also include a fractional-N unit 226 and an analog loop divider 227.

The analog loop divider 227 may be communicatively coupled to the analog control signal unit 221 and to the oscillator 130 and may be configured to receive the output signal from the oscillator 130. The analog loop divider 227 may be configured to divide the output signal based on a divisor signal to generate an analog feedback signal 228 that may be provided to the analog control signal unit 221. The divisor signal may be received from the fractional-N unit 226. The analog loop divider 227 may set the divisor for dividing the output signal based on the divisor signal.

The analog control signal unit 221 may be communicatively coupled to the coupling unit 140A and the analog loop divider 227 and may be configured to receive the analog feedback signal 228 from the analog loop divider 227 and the reference signal. The analog control signal unit 221 may be configured to generate the tuning analog control signal 124 based on a comparison of the analog feedback signal 228 and the reference signal. In particular, the analog control signal unit 221 may be configured to compare the phases of the analog feedback signal 228 and the reference signal. In these and other embodiments, the tuning analog control signal 124 may be proportional to a difference between the phases of the analog feedback signal 228 and the reference signal.

In some embodiments, the analog phase detector 223 may be configured to compare the phases of the analog feedback signal 228 and the reference signal and to generate an output proportional to the difference in the phases. The analog loop filter 225 may filter the output of the analog phase detector 223. The filtered output may be output by the analog control signal unit 221 as the tuning analog control signal 124. In some embodiments, the analog phase detector 223 may be an XOR gate. In these and other embodiments, the analog loop filter 225 may be a low pass filter implemented by capacitors and/or resistors and the tuning analog control signal 124 may be a voltage. In particular, the tuning analog control signal 124 may be a voltage, where the direct current (DC) component of the voltage is used to control the oscillator 130. In these and other embodiments, the reference analog control signal may be a particular voltage. For example, the reference analog control signal may be a portion of the supply voltage (VDD) for the oscillator 130. For example, the reference analog control signal may be VDD/2, VDD/3, or VDD/4, among other voltages.

The fractional-N unit 226 may be communicatively coupled to the analog loop divider 227 and the controller 150. The fractional-N unit 226 may be configured to receive an offset signal 252 from the controller 150 and the analog divide signal. Based on the offset signal 252 and the analog divide signal, the fractional-N unit 226 may generate the divisor signal that is provided to the analog loop divider 227.

In general, the analog loop divider 227 may divide the output signal using whole numbers. The fractional-N unit 226 may be configured to toggle the value of the divisor signal between multiple whole numbers.

An example of how the analog PLL 120A operates with the fractional-N unit 226 follows. Assume the reference signal has a frequency of 1 megahertz (MHz), the output signal has a frequency of 10.5 MHz, and the analog feedback signal 228 has a frequency of 1 MHz. The fractional-N Unit 226 may toggle the value of the whole number divisor values provided to the analog loop divider 227 so that an average of the value of the divisor values provided to the analog loop divider 227 is 10.5 to allow the frequency of the analog feedback signal 228 to approximate the frequency of the reference signal.

The coupling unit 140A may include a switch 240 configured to communicatively couple or decouple the analog control signal unit 221 to or from the oscillator 130. FIG. 2A illustrates the switch 240 communicatively decoupling the analog control signal unit 221 from the oscillator 130 and providing the reference analog control signal to the oscillator 130. As a result, the tuning analog control signal 124 does not reach the oscillator 130 and the output of the oscillator 130 is based on the reference analog control signal and the tuning digital control signal 114.

With the switch 240 communicatively decoupling the analog control signal unit 221 from the oscillator 130, the digital PLL 110A may generate an output signal at a particular frequency. To generate the output signal, a digital divide signal may be provided to the digital loop divider 216. The digital loop divider 216 may divide the output signal and generate a digital feedback signal 218. The digital control signal unit 211 may compare the digital feedback signal 218 and the reference signal and generate the tuning digital control signal 114 that drives the output signal to the desired frequency.

While the switch 240 is communicatively decoupling an output of the analog control signal unit 221 from an analog signal port of the oscillator 130, the oscillator 130 is still providing the output signal to the analog control portion 122A of the analog PLL 120A. As a result, the analog control portion 122A may be generating the tuning analog control signal 124 even through the tuning analog control signal 124 is not provided to the oscillator 130.

In some embodiments, the analog divide signal may also be provided to the fractional-N unit 226 while the switch 240 is communicatively decoupling an output of the analog control signal unit 221 from an analog signal port of the oscillator 130. The analog divide signal may be selected based on the particular frequency of the output signal. The analog divide signal may allow the analog PLL 120A to generate the tuning analog control signal 124 that may control the oscillator 130 to generate the output signal at the particular frequency after the switch 240 communicatively couples the output of the analog control signal unit 221 with the analog signal port of the oscillator 130. Thus, based on the analog divide signal being associated with the digital divide signal, the control of the output signal may be transferred to the analog PLL 120A from the digital PLL 110A without the frequency of the output signal being changed.

However, the analog divide signal may not cause the analog PLL 120A and in particular, the analog control signal unit 221 to generate the tuning analog control signal 124 that would cause the oscillator 130 to generate the output signal with a phase that approximates or equals the phase of the output signal being controlled by the digital PLL 110A. In short, the analog divide signal may not cause the analog control signal unit 221 to generate the tuning analog control signal 124 that approximately equals or is equal to the reference analog control signal. If the switch 240 is moved to communicatively couple the output of the analog control signal unit 221 with the analog signal port of the oscillator 130, when the tuning analog control signal 124 is not approximately equal to the reference analog control signal, noise, spurs, or other disturbances may occur on the output signal and more importantly the settling time of the PLL is adversely affected.

To avoid a phase discontinuity, the tuning analog control signal 124 needs to approximately equal or be equal to the reference analog control signal, thus the offset signal 252 from the controller 150 may need to be adjusted. The controller 150 may be configured to adjust the offset signal 252 by comparing the tuning analog control signal 124 with the reference analog control signal. Based on a difference between the tuning analog control signal 124 and the reference analog control signal, the controller 150 may generate and send the offset signal 252 to the fractional-N unit 226. Based on the offset signal 252, the fractional-N unit 226 may adjust the divisor signal being sent to the analog loop divider 227. Based on the adjusted divisor signal, the analog loop divider 227 divides the output signal differently resulting in an adjusted different feedback signal 228. The adjusted different feedback signal 228 is compared to the reference signal, and the difference between the adjusted different feedback signal 228 and the reference signal causes the analog control signal unit 221 to adjust the tuning analog control signal 124. The controller 150 continues to compare the tuning analog control signal 124 with the reference analog control signal and to adjust the offset signal 252 until the tuning analog control signal 124 approximately equals or equals the reference analog control signal. When the tuning analog control signal 124 approximately equals or equals the reference analog control signal, the offset signal may be zeroed to stop adjustment of the tuning analog control signal 124.

An example of how the tuning analog control signal is adjusted to approximately equal or equal the reference analog control signal follows. Assume the reference signal has a frequency of 1 MHz and the divisor of the analog loop divider 227 is 10, the output signal has a frequency of 10 MHz and the analog feedback signal 228 has a frequency of 1 MHz. Further, assume that the tuning analog control signal 124 has a value of 300 millivolt (mV) and the reference analog control signal has a value of 400 mV. The controller 150 may detect the 100 mV difference between the tuning analog control signal 124 and the reference analog control signal. The controller 150 may send an offset signal based on the difference to the fractional-N unit 226 to change the divisor signal provided by the fractional-N unit 226 slightly for a period. When the divisor signal changes, the frequency of the analog feedback signal 228 may be adjusted slightly for the period. The slight adjustment in the frequency of the feedback signal 228 for the period may produce a change in the phase of the analog feedback signal 228.

Based on the changing phase of the analog feedback signal 228 as compared to the phase of the reference signal, the analog control signal unit 221 may adjust the tuning analog control signal 124. However, the adjusted tuning analog control signal 124 does not change the output signal because the output of the analog control signal unit 221 is communicatively decoupled from the analog signal port of the oscillator 130. When the tuning analog control signal 124 reaches 400 mV, the controller 150 may set the offset signal to be zero. Further description of the operation of the controller 150 is provided below with respect to FIGS. 4-8.

After the tuning analog control signal 124 is approximately equal or equal to the reference analog control signal, transfer of control of the output signal may be passed from the digital PLL 110A to the analog PLL 120A by changing the switch 240 to communicatively couple the output of the analog control signal unit 221 and the analog signal port of the oscillator 130.

Figure 2B:
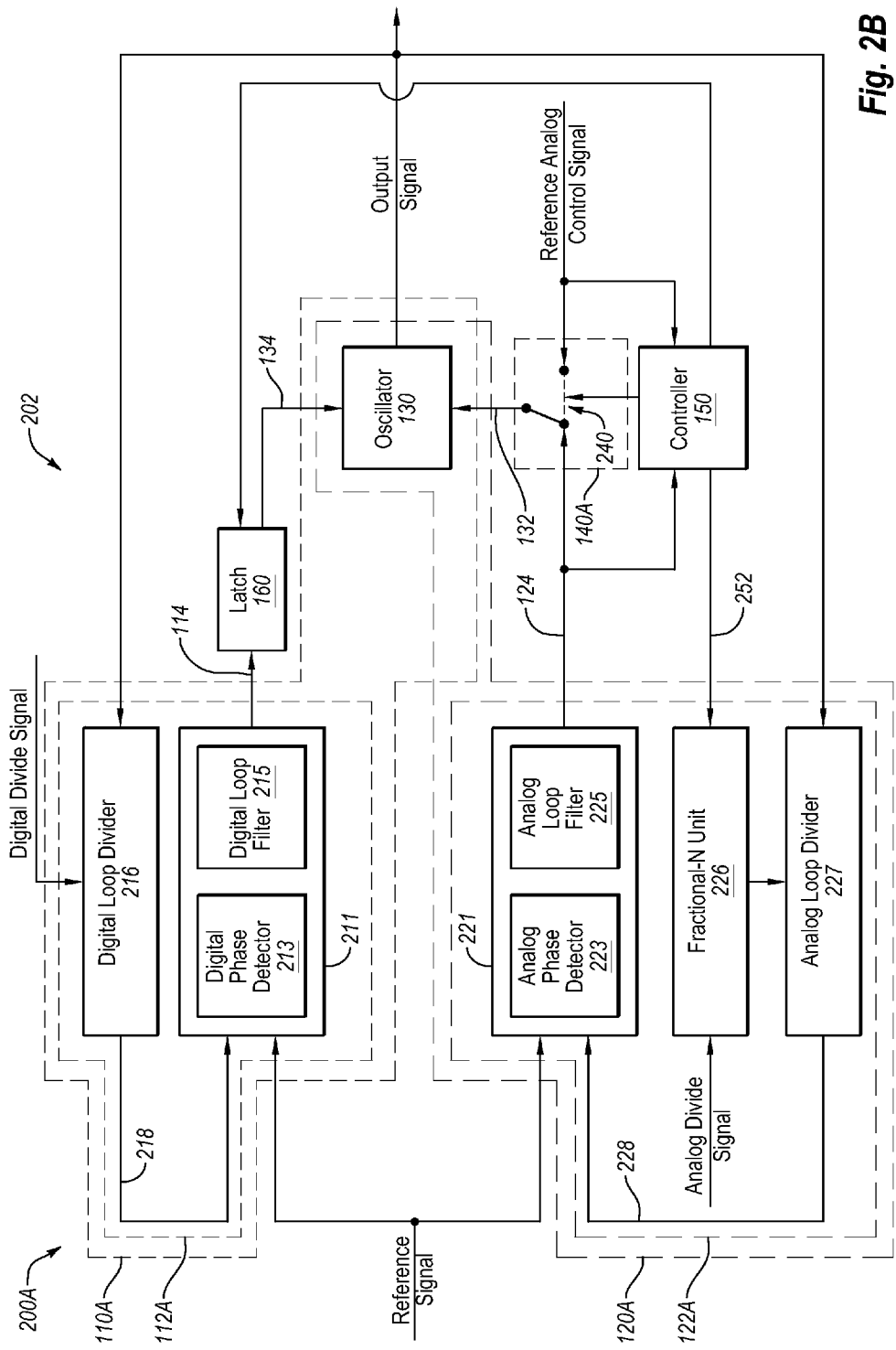
FIG. 2B is a block diagram of the example circuit of FIG. 2A in a second state.

FIG. 2B is a block diagram of the example circuit 200 of FIG. 2A in a second state where control of the output signal is transferred to the analog PLL 120A. In the illustrated embodiment, the switch 240 communicatively couples the output of the analog control signal unit 221 and the oscillator 130 so that the analog control signal unit 221 may provide the tuning analog control signal 124 to the oscillator 130. Before the switch 240 is changed to communicatively couple the output of the analog control signal unit 221 and the oscillator 130, the digital tuning control signal 114 may be latched so that the digital signal 134 provided to the oscillator 130 is no longer controlled by the digital PLL 110A.

The transfer of control of the output signal to the analog PLL 120A may be performed with reduced or no disturbance of the output signal because the digital signal 134 and the analog signal 132 may remain approximately constant during the transition. The digital signal 134 and the analog signal 132 may remain approximately constant because the digital signal 134 is the latched tuning digital control signal 114 and the analog signal 132 is the tuning analog control signal 124 which is approximately equal or equal to the reference analog control signal previously provided. Modifications, additions, or omissions may be made to the circuit 200 without departing from the scope of the present disclosure.

Figure 3:
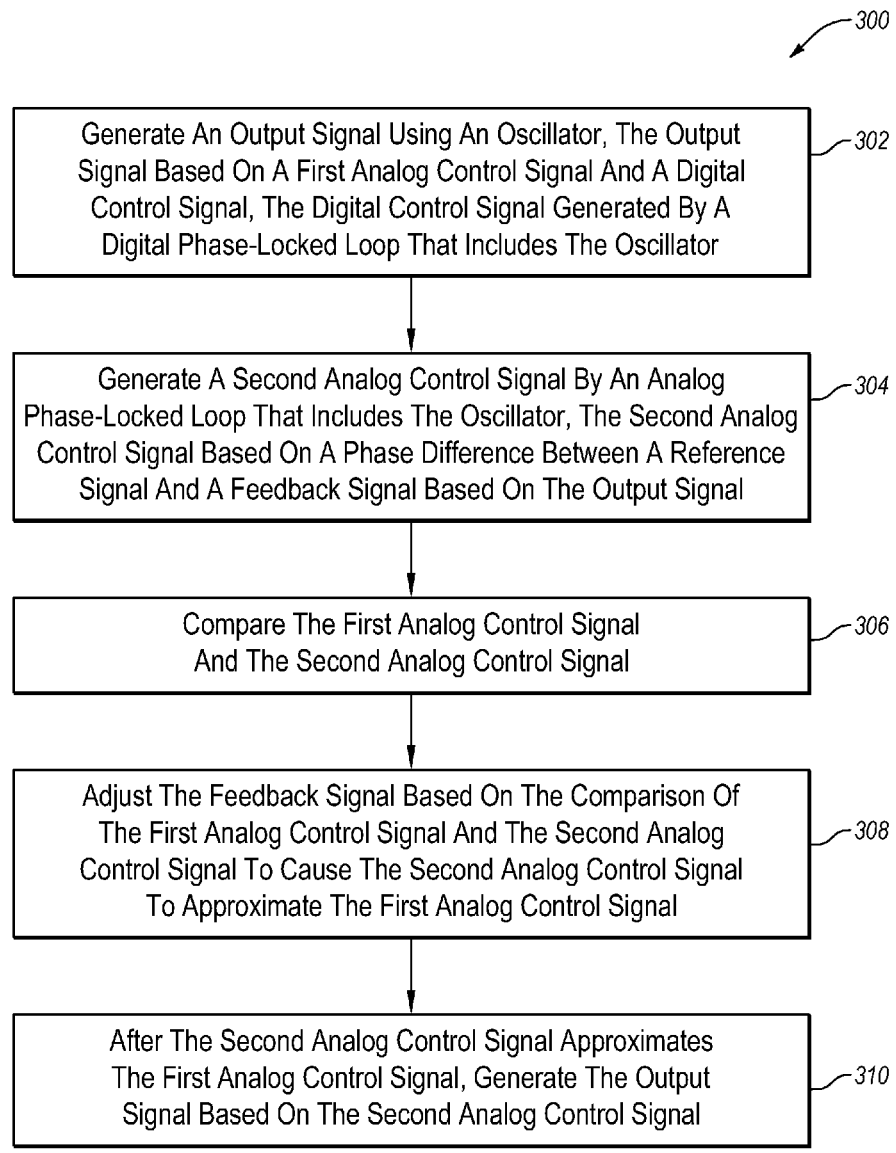
FIG. 3 is a flow chart of an example method of implementing a hybrid PLL.

FIG. 3 is a flow chart of an example method 300 of implementing a hybrid phase-locked loop, arranged in accordance with at least some embodiments described herein. The method 300 may be implemented, in some embodiments, by a circuit, such as the circuit 100 of FIG. 1 and/or the circuit 200 of FIGS. 2A and 2B. Although illustrated as discrete blocks, various blocks may be divided into additional blocks, combined into fewer blocks, or eliminated, depending on the desired implementation.

The method 300 may begin at block 302, where an output signal may be generated using an oscillator. The output signal may be based on a first analog control signal and a digital control signal. The digital control signal may be generated by a digital phase-locked loop that includes the oscillator. In some embodiments, the first analog control signal is a particular voltage. For example, the first analog control signal may be a portion of a supply voltage for the oscillator.

In block 304, a second analog control signal may be generated by an analog phase-locked loop that includes the oscillator. The second analog control signal may be based on a phase difference between a reference signal and a feedback signal. The feedback signal may be based on the output signal. In some embodiments, the feedback signal may be the result of dividing the output signal.

In block 306, the first analog control signal may be compared with the second analog control signal. In some embodiments, the first analog control signal and the second analog control signal may both be voltages. In particular, the first analog control signal and the second analog control signals may be DC voltages. The DC amplitudes of the first analog control signal and the second analog control signal may be compared. In some embodiments, a difference between the first and second analog control signals may be determined. In some embodiments, the first analog control signal may be a reference analog control signal. In these and other embodiments, the second analog control signal may be a tuning analog control signal generated by an analog control signal unit.

In block 308, the feedback signal may be adjusted based on the comparison of the first analog control signal and the second analog control signal to cause the second analog control signal to approximate the first analog control signal. In some embodiments, adjusting the feedback signal may include adjusting a divisor that divides the output signal to generate the feedback signal. In some embodiments, the adjustment may be based on the difference between the first and second analog control signals.

In block 310, after the second analog control signal approximates the first analog control signal, the output signal may be generated based on the second analog control signal. In some embodiments, when the output signal is based on the first analog control signal the digital phase-locked loop may be operating. Likewise, when the output signal is based on the second analog control signal, the digital phase-locked loop may not be operating.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, the method 300 may further include latching the digital control signal. In these and other embodiments, after the second analog control signal approximates the first analog control signal, the output signal may be generated based on the second analog control signal and the latched digital control signal.

The method 300 may further include providing the first analog control signal to the oscillator. In these and other embodiments, after the second analog control signal approximates the first analog control signal, the method 300 may further include switching to provide the second analog control signal to the oscillator so that the output signal is based on the second analog control signal.

Figure 4:
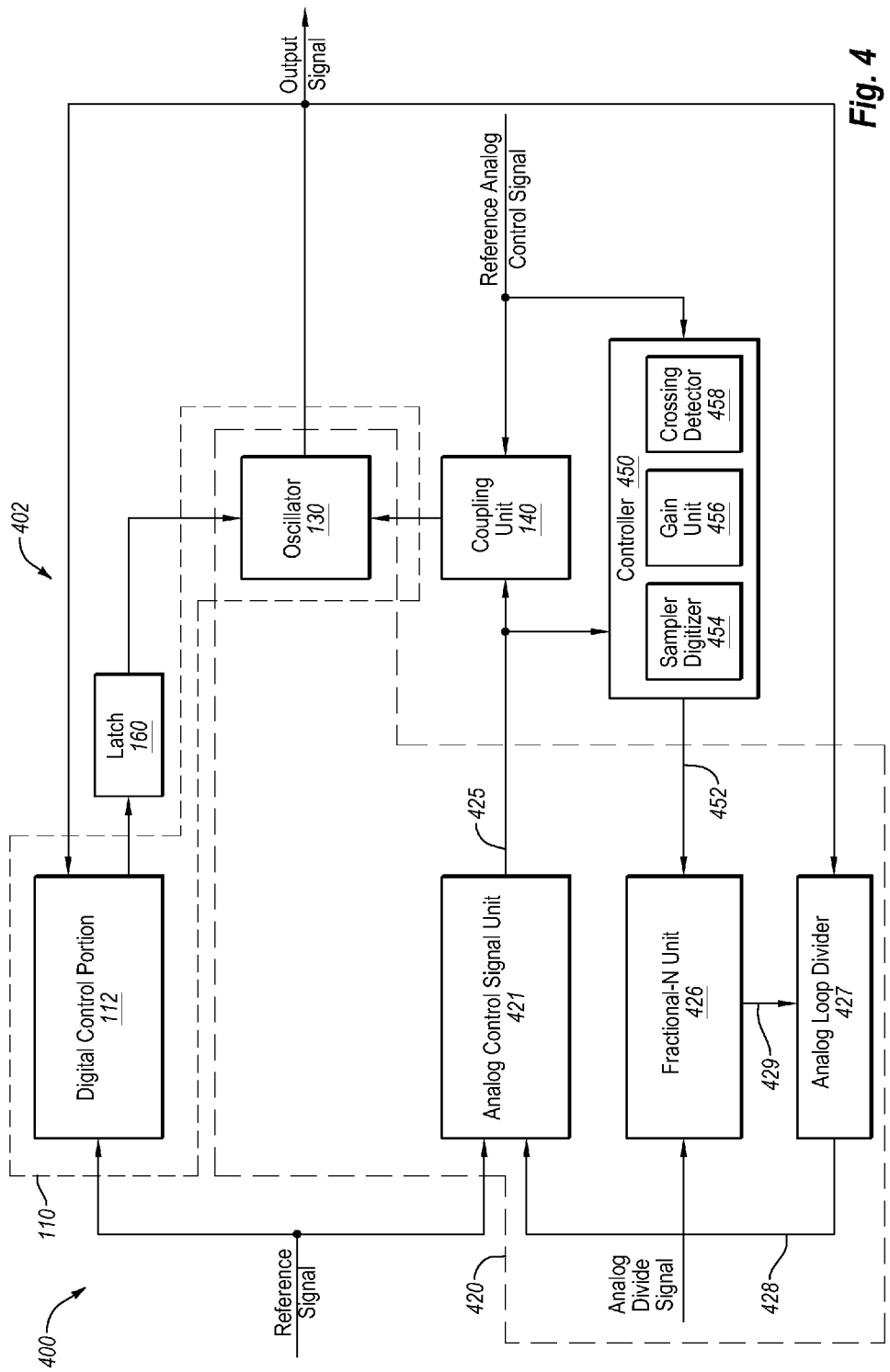
FIG. 4 is a block diagram of another example circuit that includes a hybrid PLL.

FIG. 4 is a block diagram of another example circuit 400 that includes a hybrid PLL 402, arranged in accordance with at least some embodiments described herein. The circuit 400 may illustrate an example implementation of the circuit 100 of FIG. 1.

In this example implementation of the circuit 100 of FIG. 1, the analog PLL 420 is analogous to the analog PLL 120 of FIG. 1, and the controller 450 is analogous to the controller 450 of FIG. 1. Furthermore, the circuit 400 includes the digital PLL 110, which includes the digital control portion 112; the oscillator 130; the coupling unit 140; and the latch 160 as described with respect to FIG. 1. Thus, no further description is provided herein with respect to FIG. 4 for the digital PLL 110, the digital control portion 112, the oscillator 130, the coupling unit 140, and the latch 160.

The analog PLL 420 includes an analog control signal unit 421, a fractional-N unit 426, and an analog loop divider 427. The analog loop divider 427 may be communicatively coupled to the analog control signal unit 421 and to the oscillator 130 and may be configured to receive the output signal from the oscillator 130. The analog loop divider 427 may be configured to divide the output signal based on a divisor signal 429 from the fractional-N unit 426 to generate an analog feedback signal 428 that may be provided to the analog control signal unit 421. The analog loop divider 427 may set the divisor for dividing the output signal based on the divisor signal 429.

The analog control signal unit 421 may be communicatively coupled to the coupling unit 140 and the analog loop divider 427 and may be configured to receive the analog feedback signal 428 from the analog loop divider 427 and the reference signal. The analog control signal unit 421 may be configured to generate the tuning analog control signal 425 based on a comparison of the analog feedback signal 428 and the reference signal. In particular, the analog control signal unit 421 may be configured to compare the phases of the analog feedback signal 428 and the reference signal. In these and other embodiments, the tuning analog control signal 425 may be proportional to a difference between the phases of the analog feedback signal 428 and the reference signal.

The fractional-N unit 426 may be communicatively coupled to the analog loop divider 427 and the controller 450. The fractional-N unit 426 may be configured to receive an offset signal 452 from the controller 450 and the analog divide signal. Based on the offset signal 452 and the analog divide signal, the fractional-N unit 426 may generate the divisor signal 429 that is provided to the analog loop divider 427. In particular, the fractional-N unit 426 may be configured to adjust the analog divide signal based on the offset signal 452.

Based on the adjusted analog divide signal, the fractional-N unit 426 may generate the divisor signal 429. The amount that the analog divide signal is adjusted may be based on a value of the offset signal 452 that is based on the difference between the tuning analog control signal 425 and the reference analog control signal.

The controller 450 may be communicatively coupled to the analog control signal unit 421 and the fractional-N unit 426 and may be configured to receive the tuning analog control signal 425 generated by the analog control signal unit 421 and the reference analog control signal. After the digital PLL 110 generates and controls the output signal so that the frequency of the output signal or divided output signal is approximately equal to the frequency of the reference signal, the controller 450 may compare the tuning analog control signal 425 to the reference analog control signal to generate the offset signal 452. The controller 450 may provide the offset signal 452 to the fractional-N unit 426. The offset signal 452 may be configured to cause the fractional-N unit 426 to adjust the divisor signal 429. In particular, the offset signal 452 may cause the fractional-N unit 426 to adjust the divisor signal 429 so that the analog loop divider 427 generates the feedback signal 428. The feedback signal 428 may be based on the output signal, which is based on the reference analog signal, and may cause the analog control signal unit 421 to drive the tuning analog control signal 124 to approximate the reference analog control signal.

To generate the offset signal 452, the controller 450 may include a sampler digitizer 454, a gain unit 456, and a crossing detector 458. The sampler digitizer 454 may be configured to compare the reference analog control signal and the tuning analog control signal 425. When comparing the reference analog control signal and the tuning analog control signal 425, the sampler digitizer 454 may determine a difference between the reference analog control signal and the tuning analog control signal 425. In particular, the sampler digitizer 454 may be configured to determine a difference in levels (e.g., amplitudes) of the reference analog control signal and the tuning analog control signal 425. In some embodiments, the reference analog control signal may be a DC voltage and the tuning analog control signal 425 may be a DC voltage.

The sampler digitizer 454 may be further configured to generate a difference level signal based on the difference between the reference analog control signal and the tuning analog control signal 425. In particular, the sampler digitizer may be configured to generate the difference level signal so that a value of the difference level signal is proportional to or otherwise related to the difference between the reference analog control signal and the tuning analog control signal 425. For example, when the difference between the reference analog control signal and the tuning analog control signal 425 is large, the value of the difference level signal may be large. When the difference between the reference analog control signal and the tuning analog control signal 425 is small, the value of the difference level signal may be small.

The offset signal 452 may be based on the difference level signal. As a result, the higher value of the difference level signal generated for a large difference between the reference analog control signal and the tuning analog control signal 425 may drive the tuning analog control signal 425 to the reference analog control signal faster than for a lower value of the difference level signal. By reducing the value of the difference level signal when the difference between the reference analog control signal and the tuning analog control signal 425 is smaller, the amount of overshoot (e.g., the amount that the level of the tuning analog control signal 425 passes over or under the level of reference analog control signal) and thus settling of the tuning analog control signal 425 about the reference analog control signal may be reduced.

The value of the difference level signal may also be positive or negative. The polarity of the difference level signal may be based on whether the reference analog control signal or the tuning analog control signal 425 has a greater amplitude. For example, when the level of the tuning analog control signal 425 is above the level of the reference analog control signal, the value may be positive. When the level of the tuning analog control signal 425 is below the level of the reference analog control signal, the value may be negative. The polarity of the difference level signal may affect the polarity of the offset signal 452 and thus may determine whether the fractional-N unit 426 increases or decreases a value of the divisor signal 429. For example, when the difference level signal has a positive value, the fractional-N unit 426 may increase a value of the divisor signal 429. When the difference level signal has a negative value, fractional-N unit 426 may decrease the value of the divisor signal 429. For example, the values of the difference level signal may be a value between −256 and 256, excluding zero. Alternately or additionally, the value of the difference level signal may be some other value.

In some embodiments, the value of the difference level signal generated by the sampler digitizer 454 when the difference between the reference analog control signal and the tuning analog control signal 425 is small may be positive one or negative one. For example, when the difference between the reference analog control signal and the tuning analog control signal 425 is between a positive low threshold and zero, for example, between zero and 5 mV, 1 mV, or 0.5 mV, among others, the sampler digitizer 454 may generate the difference level signal with a value of positive one. When the difference between the reference analog control signal and the tuning analog control signal 425 is between a negative low threshold and zero, for example, between zero and −5 mV, −1 mV, or −0.5 mV, among others, the sampler digitizer 454 may generate the difference level signal with a value of negative one. The sampler digitizer 454 may send the generated difference level signal to the crossing detector 458 and the gain unit 456.

The crossing detector 458 may be configured to determine when the level of the tuning analog control signal 425 crosses the level of the reference analog control signal based on the comparison of the reference analog control signal and the tuning analog control signal 425 received from the sampler digitizer 458. For example, assume the level of the reference analog control signal is 400 mV and the starting level of the tuning analog control signal 425 is 350 mV. When the level of the tuning analog control signal 425 is adjusted, it may be adjusted so that the level increases to 400.8 mV. When increasing to 400.8 mV, the level of the tuning analog control signal 425 crosses the level of reference analog control signal, 400 mV. The level of the tuning analog control signal 425 crossing the level of the reference analog signal may be referred to herein as a convergence crossing.

A convergence crossing may occur when the level of the tuning analog control signal increases to be above when it was below the level of the reference analog control signal or the level of the tuning analog control signal decreases to be below the level of the reference analog control signal when it was above the level of the reference analog control signal. In some embodiments, a convergence crossing may be determined based on the difference between the reference analog control signal and the tuning analog control signal 425. For example, the difference may be determined by subtracting the reference analog control signal from the tuning analog control signal 425. The difference between the reference analog control signal and the tuning analog control signal 425 changing from positive to negative or from negative to positive indicates a convergence crossing.

In some embodiments, the crossing detector 458 may determine a convergence crossing based on the output value of the sampler digitizer 454. The value of the difference level signal, as discussed previously, may be based on the difference between the reference analog control signal and the tuning analog control signal 425. In particular, the crossing detector 458 may determine a convergence crossing when the value of the difference level signal changes from positive one to negative one or from negative one to positive one. In essence, the crossing detector 458 may determine a convergence crossing when the difference between the reference analog control signal and the tuning analog control signal 425 is positive and between zero and the positive low threshold and the difference between the reference analog control signal and the tuning analog control signal 425 changes to be negative and is between zero and the negative low threshold.

In some embodiments, the crossing detector 458 may determine a convergence crossing has occurred based on a majority of values for the difference level signal during a particular voting period of time. In these and other embodiments, the sampler digitizer 454 may generate the difference level signal based on a clock signal. For each rising edge, falling edge, and/or rising and falling edge of the clock signal, the sampler digitizer 454 may set the value of the difference level signal based on the difference between the reference analog control signal and the tuning analog control signal 425. The crossing detector 458 may store a number of previous values of the difference level signal during the particular voting period of time. The crossing detector 458 may then make determinations based on the majority of the previous values being stored. The number of previous values stored may be an odd number of previous values to allow for a majority to be determined. For example, the number of previous values stored may be 3, 5, 7, 9, 11, 13, or some other odd number. The crossing detector 458 may determine a convergence crossing has occurred when the majority of previous values are positive one and then the majority of previous values changes to be negative one or vice versa.

The number of previous values stored, and thus the particular voting period, make the controller 450 less susceptible to noise. For example, if the tuning analog control signal 425 or the reference analog control signal are noisy, the crossing detector 458 may detect a convergence crossing due to changes in noise and not the levels of the reference analog control signal and the tuning analog control signal 425 crossing. Since the noise is not typically constant, the noise may affect the value of the difference level signal at one clock signal, but when the crossing detector 458 makes a determination based on the majority of stored values of the difference level signal, a value based on noise may have a reduced effect on the crossing detector's 458 determination.

Increasing the number of previous values of the difference level signal being stored, and thus the particular voting period, may lead to the controller 450 being more stable and less susceptible to noise up to a limit. When the number of previous values stored becomes too large based on the clock signal, the crossing detector 458 may miss convergence crossing while waiting for a majority.

An example of the crossing detector 458 making determinations based on the majority of the previous values being stored is as follows. Assume the crossing detector 458 stores five previous values of the difference level signal and the five previous values are 2, 2, 2, 1, and 1, with the oldest previous value being the first value listed. At the next rising, falling, or rising and/or falling edge of the clock signal, sampler digitizer 454 may generate the difference level signal with a value of 1. The five previous values of the difference level signal are updated to be 2, 2, 1, 1, and 1. A majority of the values are now values of 1. At subsequent clock cycles of the clock signal, the crossing detector 458 then receives the difference level signal with values of 1, −1, −1, and −1. As a result, the five previous values for each of the values received is 2, 1, 1, 1, and 1; 1, 1, 1, 1, and −1; 1, 1, 1, −1, and −1; and 1, 1, −1, −1, and −1. The crossing detector 458 now has a majority of negative one values. Since the last majority was positive one values, the crossing detector 458 may determine that a convergence crossing has occurred.

In some embodiments, if a majority of values is positive one and then the next majority of values is not negative one or vice versa, a convergence crossing may not be determined to occur even when the level of the tuning analog control signal 425 crosses the level of the reference analog control signal. For example, when the majority of values is positive one and then the next majority of values is negative two or a negative value that is not one, the crossing detector 458 may not determine that a convergence crossing has occurred. The crossing detector 458 may be configured to indicate to the gain unit 456 when it detects a convergence crossing.

As indicated, the crossing detector 458 making a determination based on the majority of stored values of the difference level signal may reduce an effect of noise on the crossing detector's 458 determination that a convergence crossing has occurred. Other methods may be used to determine when a convergence crossing has occurred based on multiple samples. For example, order statistic filters may be used with multiple samples to determine when a convergence crossing occurs.

In some embodiments, the crossing detector 458 may determine when a majority of the stored values of the difference level signal indicates that a convergence crossing has occurred using bins assignments to file and separate measured results. For example, the crossing detector 458 may include five bins. The first bin may include a count for values of the difference level signal that are greater than one, a second bin may include a count for values of the difference level signal that are less than negative one, a third bin may include a count for values of the difference level signal that are one, a fourth bin may include a count for values of the difference level signal that are negative one, and a fifth bin may include a count for values of the difference level signal that are zero indicating that the value is undefined or initialized. When the crossing detector 458 receives a difference level signal, the crossing detector 458 increases a count of the bin corresponding to the value of the received difference level signal and removes a count from the bin that is based on a value that was received outside the current voting period. When the number of counts in a single bin is a majority of the counts in all of the bins, the crossing detector 458 makes a determination of convergence crossing based on the bin with a majority. Thus, the crossing detector 458 may determine a convergence crossing when the third or fourth bins that include a count for values that are positive or negative one have a majority of counts.

The gain unit 456 may be configured to receive the difference level signal from the sampler digitizer 454. The gain unit 456 may apply a gain to the difference level signal to generate the offset signal 452. The gain applied to the difference level signal may be based on an adjustment step size related to an amount to adjust the analog divide signal. In some embodiments, the adjustment step size, and thus the gain applied by the gain unit 456, may be a value between $2^{-4}$ and $2^{-20}$. For example, when the value of the difference level signal is 20 and the gain of the gain unit 456 is $2^{-12}$, the value of the offset signal 452 is $20*2^{-12}$. The analog divide signal is then adjusted by adding $20*2^{-12}$ to the analog divide signal.

The gain unit 456 may be further configured to reduce the gain applied to the difference level signal, and thus the adjustment step size of the gain unit 456, based on the number of convergence crossings detected by the crossing detector 458. For example, after the crossing detector 458 has detected a convergence crossing, the gain unit 456 may reduce the gain applied to the difference level signal provided by sampler digitizer 454 and thus reduce the value of the offset signal 452 passed to the fractional-N unit 426. In particular, the gain unit 456 may reduce the gain applied to the difference level signal based on the number of convergence crossings detected by the crossing detector 458. In some embodiments, for each convergence crossing detected the gain unit 456 may reduce the gain applied to the difference level signal by half or by some other fraction, such as by ⅔, ⅓, ¼, or ⅕, among others. For example, the gain applied to the difference level signal generated by the sampler digitizer 454 before a convergence crossing is detected may be $2^{-6}$ and may be reduced by the gain unit 456 by ½ for every convergence crossing detected. Thus, after a first convergence point is detected, the gain unit 456 may reduce the value to $2^{-7}$. After a second convergence point is detected, the gain unit 456 may reduce the value to $2^{-8}$. After a third convergence point is detected, the gain unit 456 may reduce the value to $2^{-9}$. The reduction of the gain applied to the difference level signal by the gain unit 456 is further explained with respect to FIG. 6.

In general, the gain unit 456 thus acts to increase the resolution of the sampler digitizer 454. The increased resolution reduces the time to minimize the difference between the reference analog control signal and the tuning analog control signal 425. When the difference between the reference analog control signal and the tuning analog control signal 425 is small, the offset signal 452 may toggle above and below the smallest offset level. For example, in some embodiments, the smallest offset level may be $2^{-20}$.

In some embodiments, the gain unit 456 may reduce the gain applied to the difference level signal when the value of the difference level signal is one. Thus, if the crossing detector 458 indicates a convergence crossing, but the value of the difference level signal as generated by the sampler digitizer 454 is above one (e.g., the difference between the reference analog control signal and the tuning analog control signal 425 is above the low threshold or below the negative low threshold), the gain unit 456 may not reduce the gain applied to the difference level signal. For example, when the difference between the reference analog control signal and the tuning analog control signal 425 is above the positive low threshold, a larger value on the offset signal 452 may be desired to more quickly drive the tuning analog control signal 425 to the reference analog signal and to reduce the difference there between. When the difference between the reference analog control signal and the tuning analog control signal 425 is below the positive low threshold, finer tuning of the value of the offset signal 452 may be achieved by the gain unit 456 to minimize the time for the tuning analog control signal 425 to approximately equal or equal the reference analog signal.

In some embodiments, the controller 450 may operate so that the value of the offset signal 452 is not zero to cause the fractional-N unit 426 and the analog loop divider 427 to adjust the phase of the feedback signal 428 until the tuning analog control signal 425 is approximately equal or equal to the reference analog control signal. Alternately or additionally, the controller 450 may operate so that the value of the offset signal 452 is not zero to cause the fractional-N unit 426 and the analog loop divider 427 to adjust the phase of the feedback signal 428 until a number of convergence crossings reaches a threshold. The threshold may be determined based on the parameters of the analog PLL 420 and a desired difference between the level of the tuning analog control signal 425 and the level of the reference analog control signal when switching control of the output signal to the analog PLL 420. For example, a smaller desired difference, such as zero, may be achieved by having a large number of convergence crossings occur before switching control of the output signal. A larger desired difference may be achieved by having a smaller number of convergence crossings occur before switching control of the output signal.

Modifications, additions, or omissions may be made to the circuit 400 without departing from the scope of the present disclosure. For example, in some embodiments, the sampler digitizer 454 may be an analog to digital converter (ADC). In these and other embodiments, the difference level signal may be a digital signal and the value of the difference level signal may be a digital value that represents the difference between the tuning analog control signal 425 and the reference analog control signal. In these and other embodiments, the sampler digitizer 454 may have uniform steps. Furthermore, in these and other embodiments, the adjustment step size may be fixed. As another example, the circuit 400 may include a second analog loop divider. In these and other embodiments, the offset signal 452 provided by the controller 450 may be provided to a second fractional-N unit that is coupled to the second analog loop divider. The offset signal 452 may cause the second fractional-N unit to direct the second analog loop divider to divide the output signal. In these and other embodiments, the fractional-N unit and the analog loop divider 427 may divide the output signal or the divided output signal from the second analog loop divider based on the analog divide signal.

Figure 5:
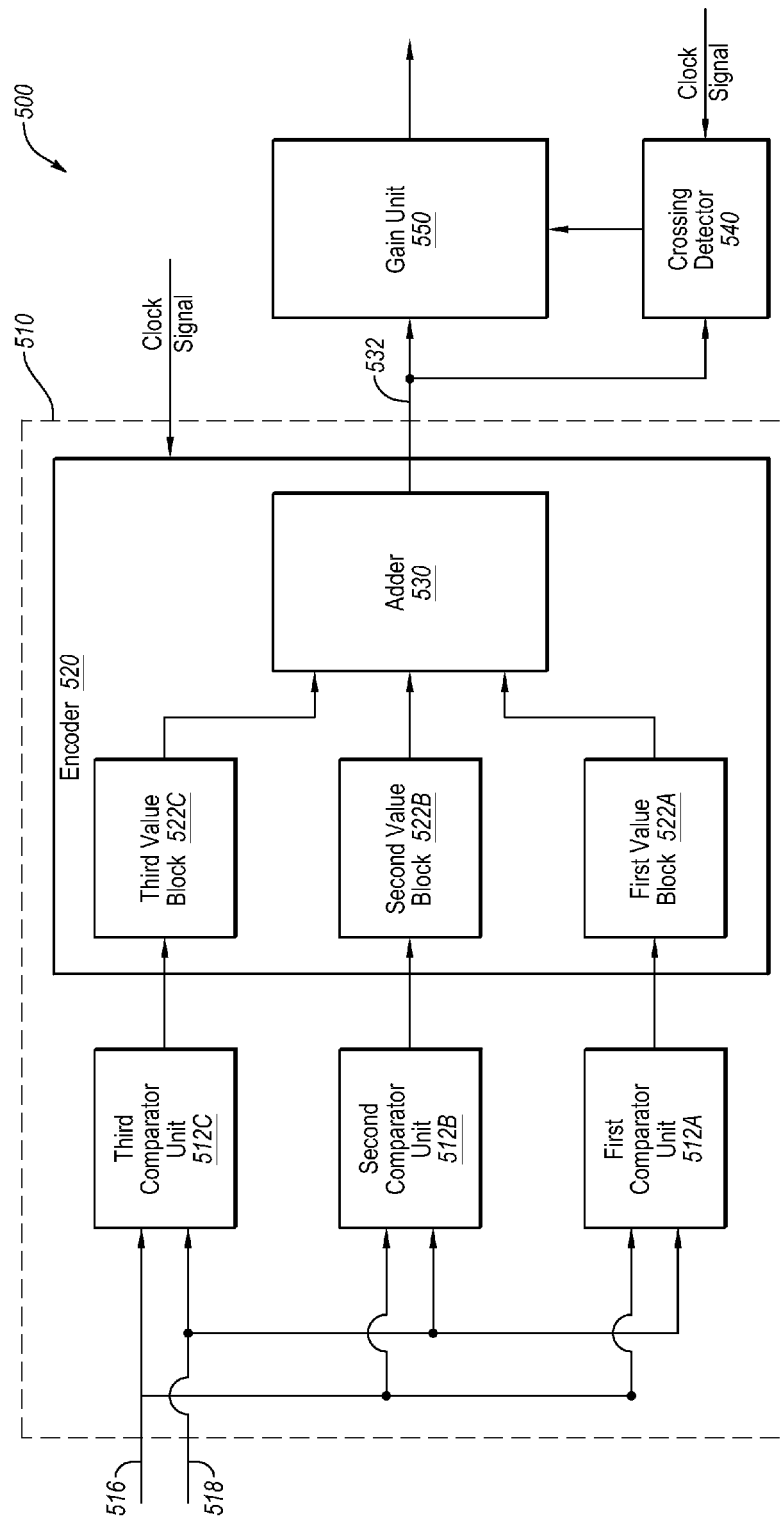
FIG. 5 is a block diagram of an example controller that may be implemented with a hybrid PLL.

FIG. 5 is a block diagram of an example controller 500 that may be implemented with a hybrid PLL, arranged in accordance with at least some embodiments described herein. The controller 500 may illustrate an example implementation of the controller 450 of FIG. 4. The controller 500 includes a sampler digitizer 510, a crossing detector 540, and a gain unit 550. The sampler digitizer 510, the crossing detector 540, and the gain unit 550 may be analogous to the sampler digitizer 454, the crossing detector 458, and the gain unit 456, respectively of FIG. 4.

The sampler digitizer 510 may be configured to generate a difference level signal 532 with a value that is proportional to or otherwise based on the difference between a level of a first analog signal 516 and a level of a second analog signal 518 received at the sampler digitizer 510.

To generate the difference level signal 532, the sampler digitizer 510 may include three comparator units, including a first comparator unit 512A, a second comparator unit 512B, and a third comparator unit 512C, referred to collectively as the comparator unit(s) 512, and an encoder 520.

Each of the comparator units 512 may be configured to compare the level of the first analog signal 516 to the level of the second analog signal 518. In some embodiments, the first analog signal 516 may be analogous to the tuning analog control signal 425 of FIG. 4 and the second analog signal 518 may be analogous to the reference analog control signal of FIG. 4.

Each of the comparator units 512 may have a distinct threshold value. When an absolute value of a difference between the level of the first analog signal 516 to the level of the second analog signal 518 is above and/or equal to a threshold value for a given comparator unit 512, the comparator unit 512 may send a threshold signal to the encoder 520. Each comparator unit 512 may also provide a positive/negative signal to the encoder 520 based on whether the level of the first analog signal 516 is above or below the level of the second analog signal 518.

The encoder 520 may be configured to generate the difference level signal 532 based on the threshold signals and positive/negative signals received from the comparator units 512. To generate the difference level signal 532, the encoder 520 may include a value block for each of the comparator units 512. In the illustrated embodiment of FIG. 5, the encoder 520 includes three value blocks, a first value block 522A, a second value block 522B, and a third value block 522C, referred to collectively as the value block(s) 522. The encoder 520 may also include an adder 530.

Each of the value blocks 522 may correspond with a specific one of the comparator units 512. For example, the third comparator unit 512C may correspond with the third value block 522C. Each of the value blocks 522 may have a unique value. On a rising and/or falling edge of a clock signal received by the encoder 520, each of the value blocks 522 may determine if its corresponding comparator unit 512 has provided the threshold signal indicating that the absolute value of the difference between the level of the first analog signal 516 and the level of the second analog signal 518 is above a threshold value for the corresponding comparator unit 512. The value blocks 522 that receive the threshold signals from their corresponding comparator units 512 may each send a digital value corresponding to their values to the adder 530. The digital values sent to the adder 530 may be positive or negative based on the positive/negative signals received by the value blocks 522 that send the digital values. In some embodiments, the digital value may be negative when the level of the first analog signal 516 is below the level of the second analog signal 518 and the digital value may be positive when the level of the first analog signal 516 is above or equal to the level of the second analog signal 518.

The adder 530 may be configured to sum the digital values received from the value blocks 522. The resulting sum is output as the difference level signal 532.

In some embodiments, the values of the value blocks 522 may be uniformly spaced. Alternately or additionally, the values of the value blocks 522 may be non-uniformly spaced. In some embodiments, the values of the value blocks 522 may correspond with the threshold value of the comparator units 512 that correspond to the value blocks 522. Alternately or additionally, one of the value blocks 522 may have a value of one and its corresponding comparator unit 512 may have a threshold value of zero. As a result, the corresponding comparator unit 512 may send a threshold signal at every rising and/or falling edge of the clock. Furthermore, the corresponding comparator unit 512 may also send the positive/negative signal at every rising and/or falling edge of the clock. Thus, in these embodiments, the one of the value blocks 522 may generate a positive or negative value of a least significant bit of the encoder 520 on each or approximate each of the rising and/or falling edge of the clock signal. In this manner, the sampler digitizer 510 may generate an offset signal with at least a negative or a positive value of the least significant bit regardless of the difference between the level of the first analog signal 516 and the level of the second analog signal 518.

In some embodiments, the sampler digitizer 510 as described may be an ADC. In particular, the sampler digitizer 510 as described may be a flash ADC with uniform or non-uniform steps.

An example of the thresholds and values of the sampler digitizer 510 follows. The first comparator unit 512A may have a threshold value of zero, the second comparator unit 512B may have a threshold value of 1.0 mV, and the third comparator unit 512C may have a threshold value of 2 mV. A value of the first value block 522A may be positive one or negative one, a value of the second value block 522B may be positive two or negative two, and a value of the third value block 522C may be positive four or negative four. When the level of the first analog signal 516 is 2.5 mV above the level of the second analog signal 518, the first, second, and third comparator units 512A, 512B, and 512C may each send a threshold signal and a positive signal to the first, second, and third value units 522A, 522B, and 522C, respectively. As a result, the first, second, and third value units 522A, 522B, and 522C may provide values of 1, 2, 4, respectively, to the adder 530. The adder 530 may sum the values from the first, second, and third value units 522A, 522B, and 522C and generate the difference level signal 532 with a value of 7.

As another example, when the level of the first analog signal 516 is 1.5 mV below the level of the second analog signal 518, the first and second comparator units 512A and 512B may each send a threshold signal and a negative signal to the first and second value units 522A and 522B, respectively. As a result, the first and second value units 522A may send values of −1 and −2, respectively, to the adder 530. The adder 530 may sum the values from the first and second value units 522A and 522B and generate the difference level signal 532 with a value of −3.

The number of comparators units 512 and values units 522 within the sampler digitizer 510 may depend on the desired resolution and range of the sampler digitizer 510. Furthermore, the threshold values for the comparator units 512 and the values for the value units 522 may depend on the potential differences between the levels of the first and second analog signals 516 and 518 and desired value for the difference level signal 532 and thus the offset signal. The desired value of the offset signal may depend on an amount of time available for the level of the first analog signal 516 to be driven to the level of the second analog signal 518. For example, in some embodiments, the sampler digitizer 510 may have 4, 6, 8, 12, or 16 comparator units 512 and value units 522. For example, the thresholds may be 0, 0.5, 1, 2, 4, 8, 16, and 32 mV, and the corresponding values may be 1, 2, 4, 8, 16, 32, 64, and 128, respectively.

As noted, the sampler digitizer 510 may output the difference level signal 532. The crossing detector 540 and the gain unit 550 may be coupled to the sampler digitizer 510 and may be configured to receive difference level signal 532 outputs by the sampler digitizer 510.

The crossing detector 540 may be configured to determine when the level of the first analog signal 516 crosses the level of the second analog signal 518, referred to as a convergence crossing, based on the values of the difference level signal 532.

The crossing detector 540 may store a number of values of difference level signal 532 based on the clock signal. When a majority of the stored values changes from being positive ones to negative ones or from being negative ones to positive ones, the crossing detector 540 may determine that a convergence crossing has occurred. As a result, the crossing detector 540 may determine that a convergence crossing occurs multiple clock cycles after the majority of the stored values have changed sign. The crossing detector 540 alerts the gain unit 550 when a convergence crossing occurs.

The gain unit 550 may be configured to receive the difference level signal 532. Before a convergence crossing occurs, the gain unit 550 may apply a gain to the difference level signal 532 to generate an output signal that is sent to a fractional-N unit. When a convergence crossing has occurred, the gain unit 550 may be configured to reduce the gain applied to the difference level signal 532.

When a convergence crossing occurs, the value of the difference level signal 532 may be positive or negative one. In some embodiments, the gain unit 550 may reduce the gain applied to the difference level signal 532 consistently after a first convergence crossing. Alternately or additionally, the gain unit 550 may be configured to reduce the gain applied to the difference level signal 532 based on a number of convergence crossings that have occurred.

Modifications, additions, or omissions may be made to the controller 500 without departing from the scope of the present disclosure. For example, each of the comparator units 512 may include first and second comparator blocks and each of the value units 522 may include first and second value blocks that correspond with the first and second comparator blocks.

Figure 6:
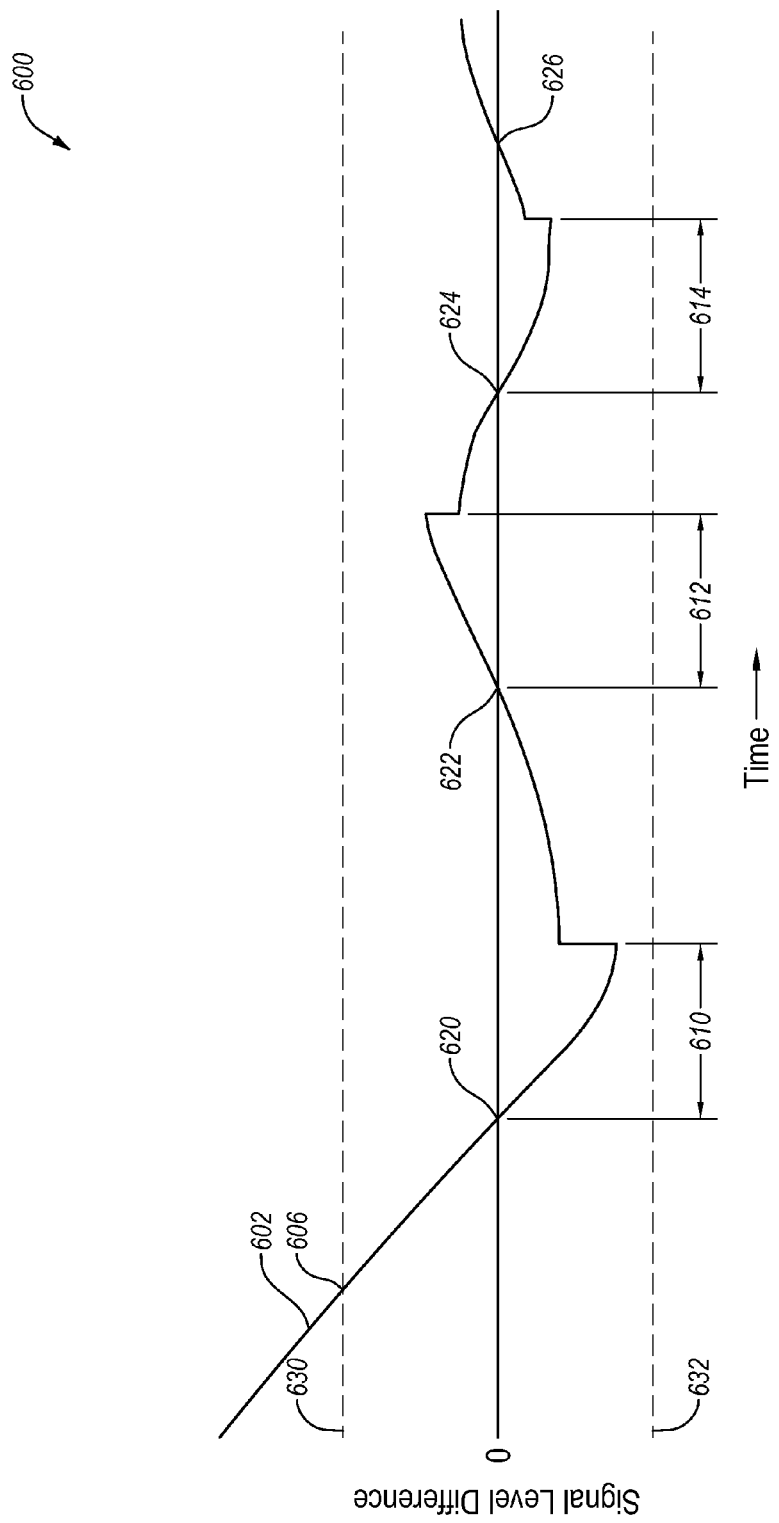
FIG. 6 is a graph plotting a difference signal that may be generated by the controller of FIG. 5.

FIG. 6 is a graph 600 plotting a difference signal 602 that may be generated by the controller of FIG. 5, arranged in accordance with at least some embodiments described herein. The difference signal 602 may represent a difference between the level of the first analog signal 516 and the level of the second analog signal 518 in FIG. 5. The graph 600 illustrates a first threshold 630 associated with the difference between the level of the first analog signal 516 and the level of the second analog signal 518 resulting in a difference level signal with a positive value greater than positive one. The graph 600 further illustrates second threshold 632 associated with the difference between the level of the first analog signal 516 and the level of the second analog signal 518 resulting in a difference level signal with a negative value less than negative one. As a result, when the difference signal 602 is between the first threshold 630 and zero, the sampler digitizer 510 may output a difference level signal with a value of positive one. When the difference signal 602 is between the second threshold 632 and zero, the sampler digitizer 510 may output a difference level signal with a value of negative one.

The graph 600 further illustrates a first polarity change 620, a second polarity change 622, a third polarity change 624, and a fourth polarity change 626. In some embodiments, the polarity changes 620, 622, 624, and 626 may be referred to as convergence crossings. Additionally, the graph 600 illustrates a first convergence crossing calculation time 610, a second convergence crossing calculation time 612, and a third convergence crossing calculation time 614.

At a point 606 where the difference signal 602 crosses the first threshold 630, the sampler digitizer 510 may output a difference level signal with a value of positive one. The crossing detector 540 may begin storing values of the difference level signal that are positive one. Before the polarity change 620, the crossing detector 540 may have stored enough values so that the majority of the stored values are positive one. After the polarity change 620, the sampler digitizer 510 may output a difference level signal with a value of negative one. The crossing detector 540 may begin storing the values of the difference level signal that are negative one. After the first convergence crossing calculation time 610, the crossing detector 540 may have stored enough values so that the majority of the stored values are negative one. Since the previous majority was positive one, the crossing detector 540 may determine that the first polarity change 620 occurred. The crossing detector 540 may indicate such to the gain unit 550. The gain unit 550 may reduce the gain applied to the difference level signal causing the abrupt change in the difference signal 602 at the end of the first convergence crossing calculation time 610.

The crossing detector 540 may further detect the second polarity change 622 and the third polarity change 624 at the end of the second convergence crossing calculation time 612 and at the end of the third convergence crossing calculation time 614, respectively. As a result, the gain unit 550 may reduce the gain applied to the difference level signal at the end of the second convergence crossing calculation time 612 and at the end of the third convergence crossing calculation time 614, causing the abrupt changes in the difference signal 602 at the end of the second convergence crossing calculation time 612 and at the end of the third convergence crossing calculation time 614.

As illustrated in FIG. 6, every time the gain unit 550 reduces the gain applied to the difference level signal, the amplitude of the difference signal 602 is reduced, indicating that the difference between the levels of the first analog signal 516 and the second analog signal 518 is becoming smaller. With the amplitude of the difference signal 602 being reduced incrementally as illustrated, soon the level of the first analog signal 516 may be equal or approximately equal to the second analog signal 518.

Figure 7:
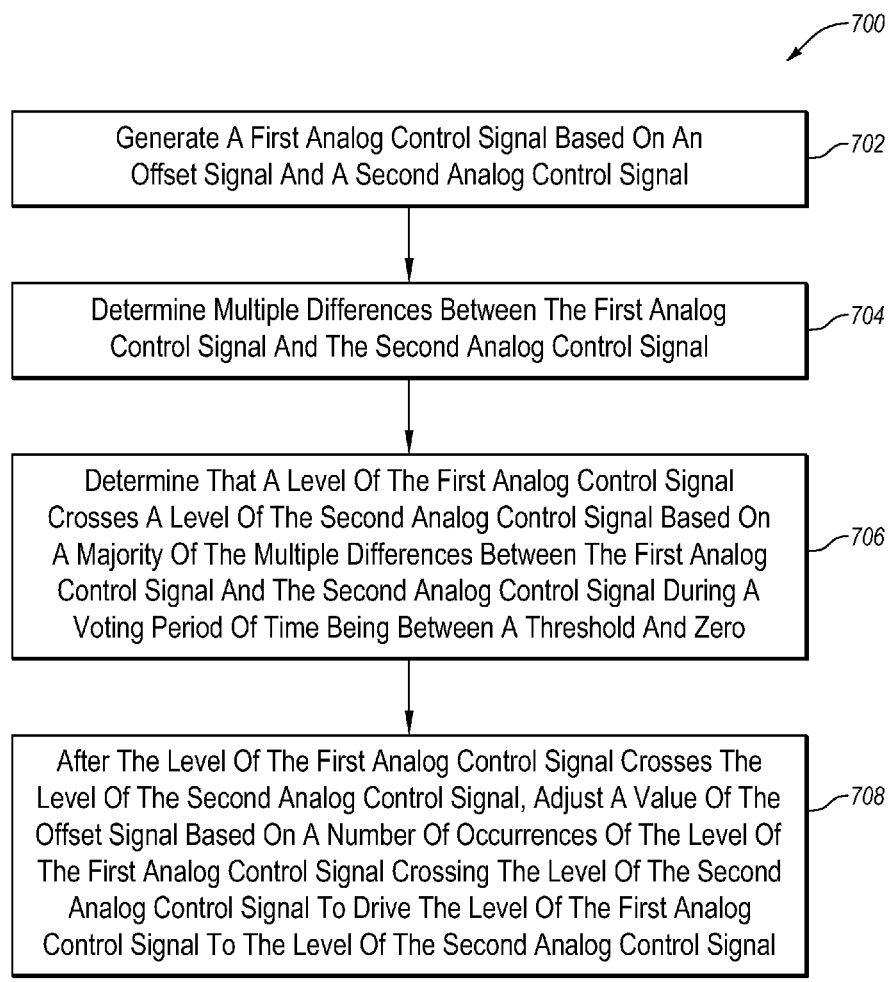
FIG. 7 is a flow chart of an example method of controlling a hybrid PLL.

FIG. 7 is a flow chart of an example method 700 of controlling a hybrid PLL, arranged in accordance with at least some embodiments described herein. The method 700 may be implemented, in some embodiments, by a circuit, such as the circuit 100 of FIG. 1, the circuit 200 of FIGS. 2A and 2B, and/or the circuit 400 of FIG. 4. Although illustrated as discrete blocks, various blocks may be divided into additional blocks, combined into fewer blocks, or eliminated, depending on the desired implementation.

The method 700 may begin at block 702, where a first analog control signal may be generated based on an offset signal and a second analog control signal. In some embodiments, the first analog control signal may be a tuning analog control signal and the second analog control signal may be a reference analog control signal.

In block 704, multiple differences between the first analog control signal and the second analog control signal may be determined. In some embodiments, each of the multiple differences may be determined based on a clock signal.

In block 706, a level of the first analog control signal may be determined to cross a level of the second analog control signal based on a majority of the multiple differences between the first analog control signal and the second analog control signal during a voting period of time being between a threshold and zero.

In block 708, after the level of the first analog control signal crosses the level of the second analog control signal, a value of the offset signal may be adjusted based on a number of occurrences of the level of the first analog control signal crossing the level of the second analog control signal. The offset signal may be adjusted to drive the level of the first analog control signal to the level of the second analog control signal. In some embodiments, the offset signal may be reduced each time that the level of the first analog control signal crosses the level of the second analog control signal. For example, in some embodiments, the offset signal may be reduced by half.

The method 700 may further include adjusting the value of the offset signal based on the multiple differences between the first analog control signal and the second analog control signal.

In some embodiments, the multiple differences may be considered part of a first group of multiple differences and the threshold associated with the first group of multiple differences may be considered a first threshold. In these and other embodiments, the method 700 may further include determining a second group of multiple differences between the first analog control signal and the second analog control signal. The second group of multiple differences may occur during a second voting period of time. In some embodiments, the second period may overlap with the first period. In these and other embodiments, determining that the level of the first analog control signal crosses the level of the second analog control signal may be further based on a majority of the second group of multiple differences during the second voting period of time being between a second threshold and zero. In some embodiments, the second threshold may be negative and the first threshold may be positive or the second threshold may be positive and the first threshold may be negative.

Figure 8:
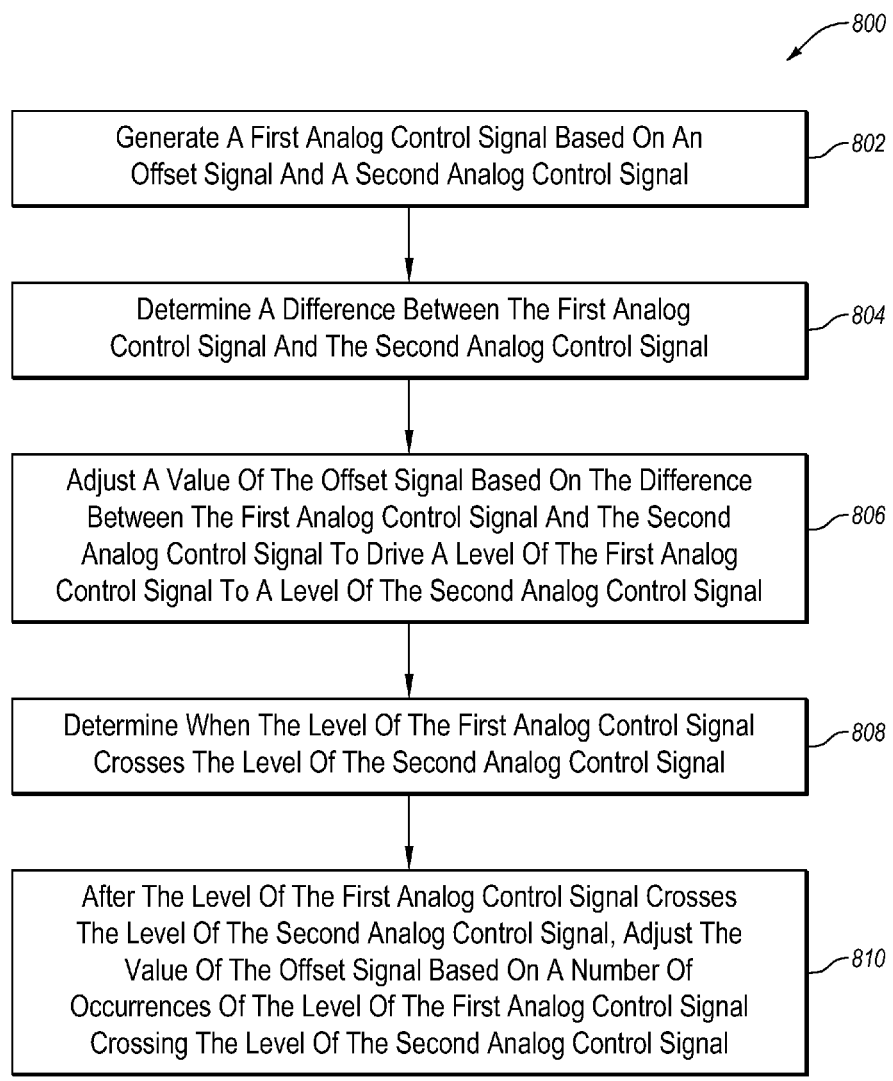
FIG. 8 is a flow chart of another example method of controlling a hybrid PLL.

FIG. 8 is a flow chart of another example method 800 of controlling a hybrid PLL, arranged in accordance with at least some embodiments described herein. The method 800 may be implemented, in some embodiments, by a circuit, such as the circuit 100 of FIG. 1, the circuit 200 of FIGS. 2A and 2B, and/or the circuit 400 of FIG. 4. Although illustrated as discrete blocks, various blocks may be divided into additional blocks, combined into fewer blocks, or eliminated, depending on the desired implementation.

The method 800 may begin at block 802, where a first analog control signal may be generated based on an offset signal and a second analog control signal. In some embodiments, the first analog control signal may be a tuning analog control signal and the second analog control signal may be a reference analog control signal.

In block 804, a difference between the first analog control signal and the second analog control signal may be determined. In some embodiments, the difference may be determined by comparing the first analog control signal and the second analog control signal.

In block 806, a value of the offset signal may be adjusted based on the difference between the first analog control signal and the second analog control signal. The offset signal may be adjusted to drive a level of the first analog control signal to a level of the second analog control signal.

In block 808, it may be determined when the level of the first analog control signal crosses the level of the second analog control signal. The determination may be performed by a controller.

In block 810, after the level of the first analog control signal crosses the level of the second analog control signal, the value of the offset signal may be adjusted based on a number of occurrences of the level of the first analog control signal crossing the level of the second analog control signal.

The method 800 may further include determining multiple differences over time between the first analog control signal and the second analog control signal. The difference between the first analog control signal and the second analog control signal may be part of the multiple differences determined. In these and other embodiments, it may be determined when the level of the first analog control signal crosses the level of the second analog control signal based on a majority of the multiple differences between the first analog control signal and the second analog control signal during a voting period of time being between a threshold and zero.

The method 800 may further include generating, by an oscillator, an output signal based on the second analog control signal and a digital control signal provided to the oscillator by a digital phase-locked loop that includes the oscillator. In these and other embodiments, after the number of determinations of the level of the first analog control signal crossing the level of the second analog control signal exceeds a threshold, the method 800 may further include providing the first analog control signal to the oscillator in place of the second analog control signal and stopping operation of the digital phase-locked loop.

The method 800 may further include adjusting a divisor applied to the output signal based on the offset signal to generate a feedback signal. In these and other embodiments, the first analog control signal may be based on the feedback signal.

Although the subject matter herein has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A circuit comprising:
an analog control signal unit configured to generate a first analog control signal based on an offset signal;
a sampler digitizer configured to determine a difference between the first analog control signal and a second analog control signal and to generate a difference level signal with a value based on the determined difference between the first analog control signal and the second analog control signal;
a crossing detector configured to determine when the level of the first analog control signal crosses the level of the second analog control signal based on the difference level signal; and
a gain unit configured to apply a gain to the difference level signal to generate the offset signal based on a number of occurrences of the level of the first analog control signal crossing the level of the second analog control signal.

2. The circuit of claim 1, wherein the sampler digitizer is further configured to determine a plurality of difference level signals, wherein the crossing detector determines when the level of the first analog control signal crosses the level of the second analog control signal based on a majority of the values of the difference level signals being between a threshold and zero during a voting period of time.

3. The circuit of claim 2, wherein the sampler digitizer adjusts the value of the difference level signal to be least significant when the difference between the first analog control signal and the second analog control signal is between the threshold and zero.

4. The circuit of claim 1, wherein the gain unit is configured to reduce the gain applied to the difference level signal for each occurrence of the level of the first analog control signal crossing the level of the second analog control signal.

5. The circuit of claim 1, further comprising an oscillator configured to generate an output signal based on the second analog control signal and a digital control signal provided by a digital phase-locked loop that includes the oscillator.

6. The circuit of claim 5, further comprising a divider configured to divide the output signal based on the offset signal to generate a feedback signal, the analog control signal unit configured to generate the first analog control signal based on the feedback signal.

7. The circuit of claim 5, further comprising a coupling unit configured to provide the first analog control signal to the oscillator in place of the second analog control signal after the number of occurrences of the level of the first analog control signal crossing the level of the second analog control signal exceeds a threshold.

\* \* \* \* \*